United States Patent [19]

Haraguchi et al.

[11] Patent Number: 5,798,203
[45] Date of Patent: Aug. 25, 1998

[54] METHOD OF MAKING A NEGATIVE PHOTORESIST IMAGE

[75] Inventors: Hiroshi Haraguchi, Tokyo; Hitoshi Tsuji, Kanagawa-ken, both of Japan

[73] Assignee: Kabushiki Kaisha Toshiba, Kawasaki, Japan

[21] Appl. No.: 595,846

[22] Filed: Feb. 2, 1996

[30] Foreign Application Priority Data

Feb. 6, 1995 [JP] Japan ................. 7-018059

[51] Int. Cl.⁶ .................................. G03F 7/20
[52] U.S. Cl. ................ 430/325; 430/330; 430/394; 430/396
[58] Field of Search ....................... 430/323, 324, 430/325, 326, 328, 330, 394, 396

[56] References Cited

U.S. PATENT DOCUMENTS

| | | | |
|---|---|---|---|
| 4,104,070 | 8/1978 | Moritz et al. | 430/329 |
| 4,885,231 | 12/1989 | Chan | 430/321 |
| 4,890,309 | 12/1989 | Smith et al. | 378/35 |
| 5,480,763 | 1/1996 | Kondo | 430/320 |
| 5,551,584 | 9/1996 | Hisa | 216/2 |

FOREIGN PATENT DOCUMENTS 5-347243  12/1993  Japan.

*Primary Examiner*—Kathleen Duda
*Attorney, Agent, or Firm*—Finnegan, Henderson, Farabow, Garrett & Dunner, L.L.P.

[57] ABSTRACT

In a method of making a negative photoresist image as for lithography, a positive resist is exposed by a light radiation through a phase shift mask as a first exposing step. Next, the positive resist is changed in its character by means of baking the substrate in an amine gas atmosphere such as ammonium, to make an exposed portion insoluble by developer. Next, an unexposed potion of the positive resist is exposed a second time to a light radiation using a second mask. After the second exposing step, the positive resist is developed to remove the unexposed portion. The phase shift mask has a fine pattern constituted mask membrane and an opening placed alternatively. And the opening is covered by attenuator intermittently. The second mask has an opening so that at least one portion unexposed by the first exposing step is exposed by the second exposing step.

15 Claims, 20 Drawing Sheets

METHOD OF MAKING A NEGATIVE PHOTORESIST IMAGE

BACKGROUND OF THE INVENTION

This invention relates to a method of making a negative photoresist image as for lithography. FIG. 1 illustrates schematically the lithographic process. A predetermined pattern (made of opaque chromium) is formed on a mask 11 (made of glass). A substrate 12 is coated with positive resist. Then, a light radiation 13 is passed through the mask 11, and exposes the substrate 12. As a result, a pattern formed on the mask 11 is projected onto the positive resist.

FIG. 2 illustrates an enlarged plan view of a mask 15 of the same type as the mask illustrated in FIG. 1. FIG. 3 shows a sectional view III—III of FIG. 2.

The mask 15 includes a glass substrate 21, and a mask membrane (made of opaque chromium membrane) 22 formed on the glass substrate 21. Because the portions where the mask membrane 22 is formed block light radiation, portions where a positive resist covering a substrate are exposed by light radiation passed through the mask 15 are portions corresponding to the portions of glass substrate 21 which do not include the mask membrane 22.

FIGS. 4 and 5 illustrate an exposed portion of a positive resist 23 on a substrate 20 exposed through the mask 15 shown in FIG. 2, wherein FIG. 5 shows a sectional view V—V of FIG. 4. In FIG. 5, an underlying layer 24 is disposed on substrate 20 and the positive resist 23 thereon. In FIGS. 4 and 5, the cross marks indicate portions exposed to light. It is desirable that a pattern of the mask 11 is represented accurately on the positive resist 23. However, as a width of the mask membrane 22 becomes smaller, it is not capable of accurately blocking the light radiation, such that some light may irradiate a portion of the positive resist 23 beneath the mask membrane 22. In particular, a portion of the positive resist 23 placed under the mask membrane 22 is partially exposed (as shown in FIG. 4 by the cross marks). FIG. 5 also includes a plot of the intensity of light irradiating the positive resist 23. As seen in the intensity plot and cross-sectional view in FIG. 5, a pattern of the positive resist 22 resulting from projecting the pattern of the mask membrane 23 thereon by an exposure of the light radiation is unclear at the edge portions of the pattern.

Consequently, as a result of etching the underlying layer 24 in accordance with the pattern of the positive resist 22, a pattern of the underlying layer 24 is also unclear.

To overcome the problem described above, and to meet a demand for fineness of a pattern of a wiring layer, in lithography technology, a trend of fineness and a high-rate of accuracy has rapidly advanced in recent years.

Recently, a lithography technique using a phase shift mask has been developed and is disclosed in U.S. Pat. No. 4,890,309 of Smith et al. Moreover, Japanese patent laid open No.57-62052 describes that boundary resolution and a focus margin are improved in the case of using a Levenson type mask as a phase shift mask.

FIG. 6 illustrates an enlarged plan view of a phase shift mask 16. FIG. 7 shows a sectional view VII—VII of FIG. 6.

The mask 16 includes the mask membrane 22 made of opaque chromium formed on the glass board 21. Because the portions where the mask membrane 22 is formed block light radiation, portions where a positive resist covering a substrate are exposed by light radiation passed through the mask 16 are portions corresponding to the portions of glass substrate 21 which do not include the mask membrane 22.

Moreover, one portion of the mask 16 which does not include the mask membrane 22 on the glass substrate 21 ("opening pattern" as discussed below) is covered by an attenuator 25 formed, for example, of silicon oxide.

FIG. 8 illustrates an exposed field of the positive resist 23 by light radiation passed through the phase shift mask shown in FIGS. 6 and 7. FIG. 9 shows a sectional view IX—IX of FIG. 8.

After development of the photoresist 23, two opening patterns having a slit shape are formed on the positive resist 23 after the light exposure using the phase shift mask shown in FIGS. 6 and 7. The exposed portion of the photo resist 23 field is shown by cross marks (X).

As seen in a plot in FIG. 5 of the light intensity irradiating the positive resist 23, in the case of using the Levenson type mask, a phase of the light radiation exposing the positive resist 23 through the opening pattern of the phase shift mask covered by the attenuator 25 is shifted 180 degree in comparison to a phase of the light radiation exposing the positive resist 23 via the opening pattern of the phase shift mask not covered by the attenuator 25. As described more fully below with respect to FIG. 13, the reason for providing the 180 degree shift value is because as the phase of the light shifts from a positive value to a negative value, there is a zero-value of light intensity, which corresponds to the plot of light intensity crossing the abscissa in the plot in FIG. 13. As a result, an edge portion of the pattern of the positive resist is clear.

However, in the case where an interval between the openings in the pattern is large, the Levenson type mask cannot be effective. Moreover, in the case of a phase shift mask having only one opening pattern, referred to as a "local pattern", it cannot be effective in the same way.

The performance of lithography using the Levenson type phase shift mask is more effective in the case that a ratio of a width of the mask membrane to a width of the opening, referred to as "L/S" below, is less than "1".

FIG. 10 shows an enlarged plan view of a phase shift mask 17 having L/S equal to "1". FIG. 11 illustrates a sectional view XI—XI of FIG. 10.

On the glass substrate 21 of mask 17, there are four portions of mask membrane 22 each having a width "L". Each of the mask membrane 22 portions is positioned at an interval "S". The width "L" is equal to the interval "S". Openings 26a and 26c between the mask membrane portions are covered by the attenuator 25 intermittently.

FIG. 12 illustrates an exposed field of the positive resist 23 by light radiation passed through the phase shift mask shown in FIGS. 10 and 11. FIG. 13 shows a sectional view XIII—XIII of FIG. 12. The exposed portions are indicated by the cross marks.

After exposing the positive resist 23 to the light radiation, there is formed, on the positive resist 23, a pattern corresponding to the opening pattern of the mask 17 for the reason that portions of the mask 17 on which the mask membrane 22 is formed prevent exposure to the light radiation.

Moreover, a first phase of the light radiation passing through the openings 26a and 26c is shifted 180 degree relative to a second phase of the light radiation passing through an opening 26b (FIG. 10). Consequently, if the light radiation reaches a portion of the resist 23 aligned under the mass membrane 22 such as in a case of an interval between the mass pattern being narrow, a pattern of the positive resist 23 could result with its edge portions unclear. This could result when the interval between the mask pattern portions is too narrow for the light intensity to be reduced to less than a threshold value. On the other hand, using the phase shift mask, the light intensity is more effectively reduced to less than a threshold value near the edge portions of the mask membrane. Consequently, even if the light radiation reaches under the mask membrane 22 in the case of the interval between the mask pattern portions being narrow, a pattern of the positive resist 23 will still have clear edge portions by using the phase shift mask.

However, as shown in FIG. 12, by using the mask 21 as shown in FIG. 10, a light intensity of a portion A of the positive resist 23 corresponding to an edge of the attenuator 25 is equal to zero. Consequently, each portion A is incapable of being exposed by light radiation. Therefore, the mask pattern is incapable of being represented accurately on the positive resist 23.

Consequently, after development, the positive resist 23 remains at the portions A. As described above, the conventional method of making a negative photoresist image has a disadvantage that the portions A, that is, the portions of the positive resist 23 corresponding to the edge portions of the attenuator 25 are left unexposed.

SUMMARY OF THE INVENTION

An object of the invention is to provide a method of making a negative, fine, and high-accurate photoresist image.

According to the present invention, there is provided A method of making a negative photoresist image comprising the steps of:

Selectively exposing to light through a phase shift mask a photoresist layer on a substrate, the phase shift mask including a mask portion and an attenuator; changing an exposed portion of the positive resist layer to be resistant to developer; selectively exposing to light the positive resist layer through a second mask which blocks exposure of a portion of the positive resist layer corresponding to a peripheral portion of the attenuator not aligned with the mask portion; and developing the positive resist layer.

BRIEF DESCRIPTION OF THE DRAWINGS

In the accompanying drawings.

DETAILED DESCRIPTION OF THE PREFERRED EMBODIMENTS

Embodiments of the invention will be described below in detail on the basis of the following specific description and the drawings.

Figure 1:
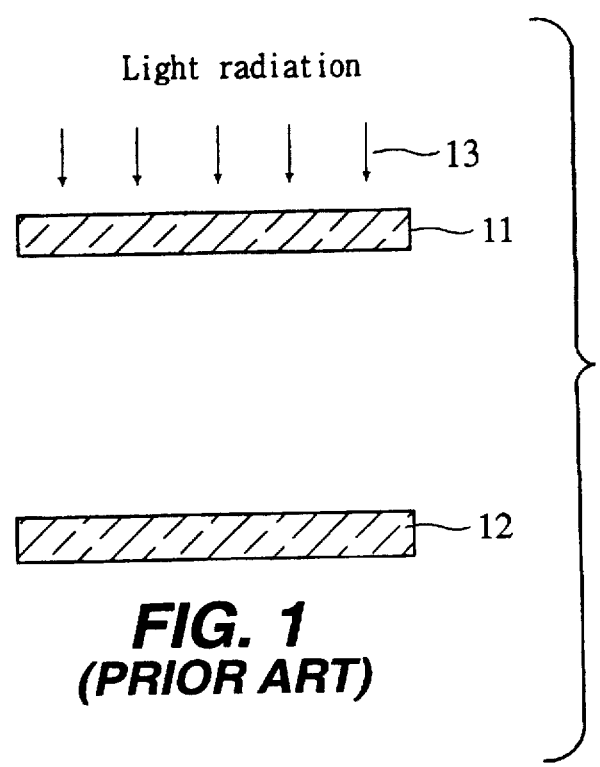
FIG. 1 is a drawing showing a relation between a mask and a substrate in an exposing step.
Figure 2:
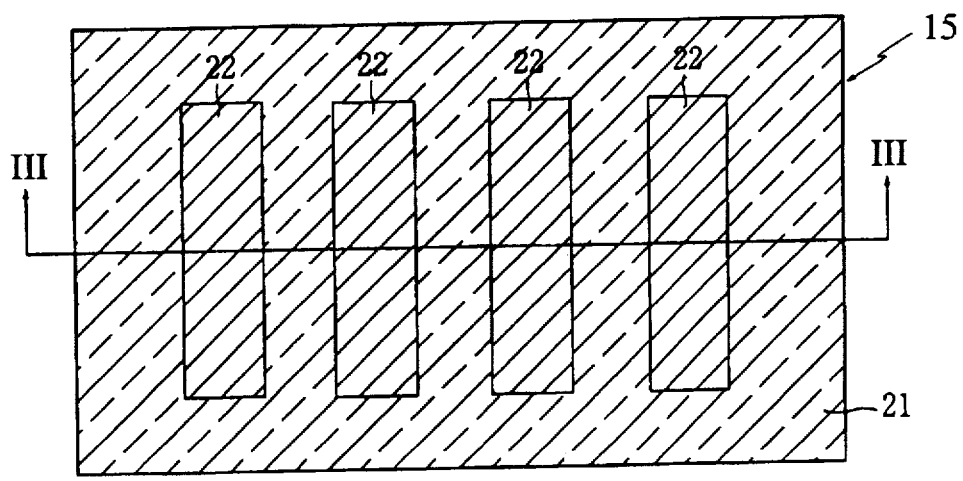
FIG. 2 is a plan view of a conventional mask.
Figure 3:
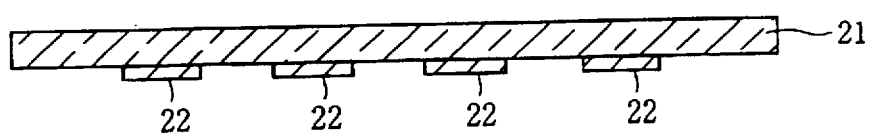
FIG. 3 is a sectional view III—III of FIG. 2.
Figure 4:
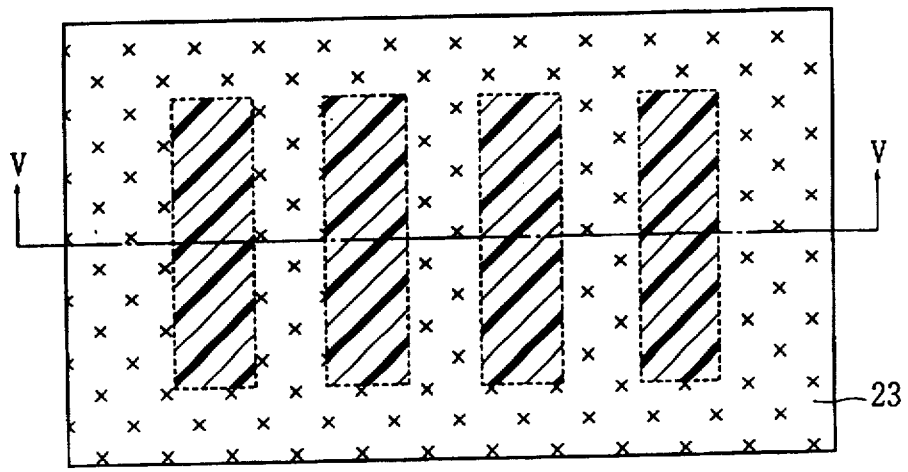
FIG. 4 is a plan view showing an exposed portion using the mask illustrated in FIG. 2.
Figure 5:
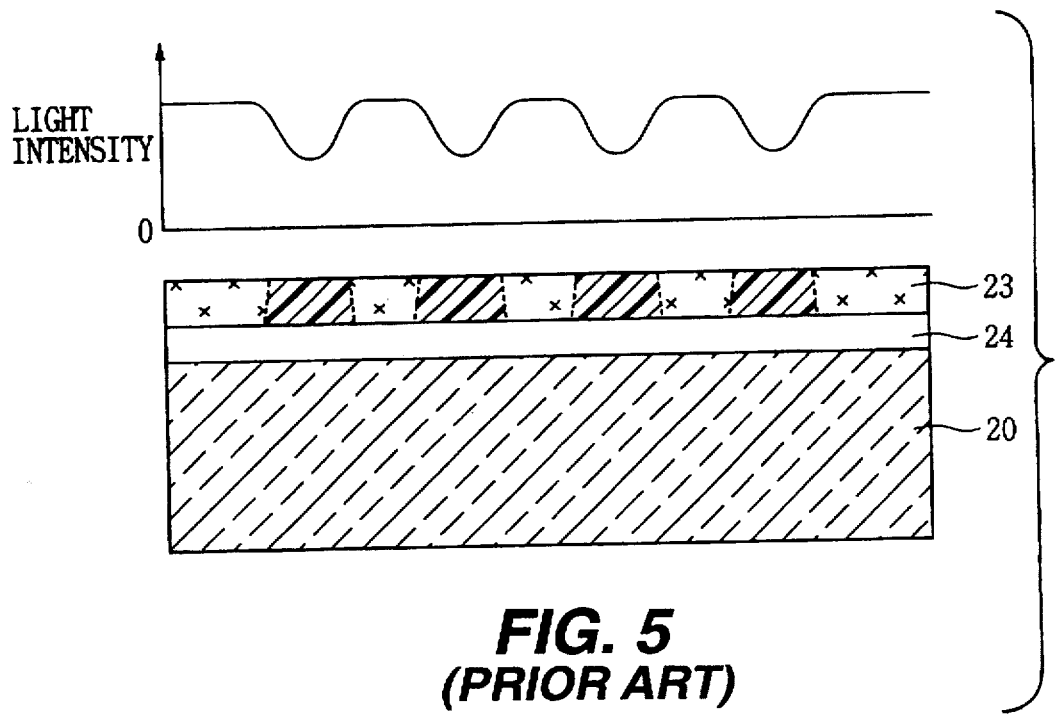
FIG. 5 is a sectional view V—V of FIG. 4.
Figure 6:
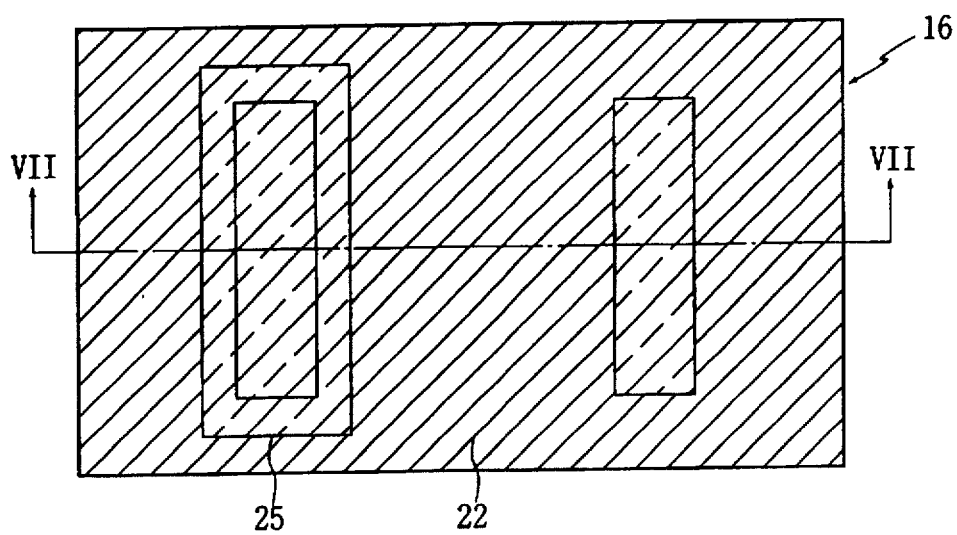
FIG. 6 is a plan view showing a phase shift mask used in a conventional light exposure step.
Figure 7:
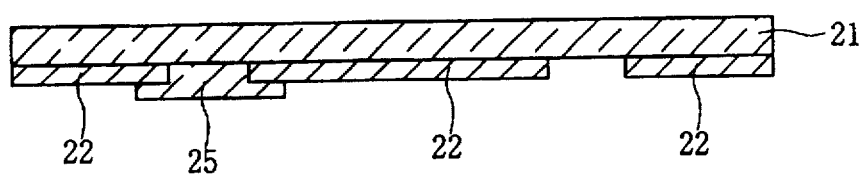
FIG. 7 is a sectional view VII—VII of FIG. 6.
Figure 8:
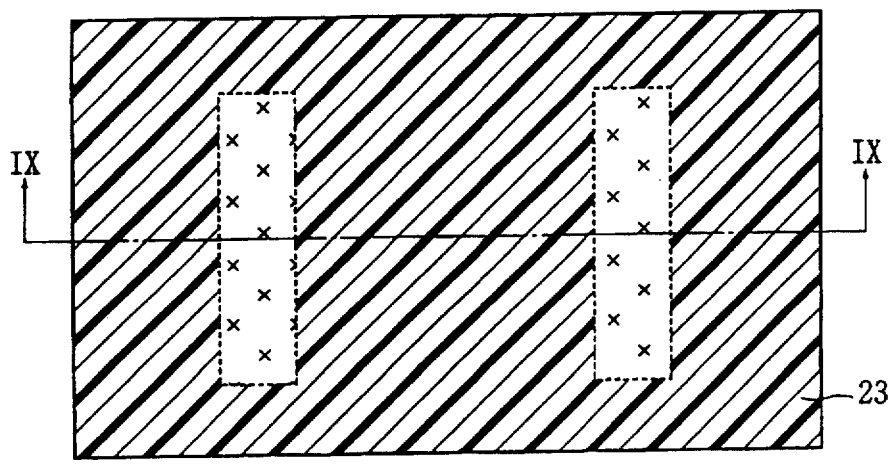
FIG. 8 is a plan view showing a exposed portion using the mask illustrated in FIG. 6.
Figure 9:
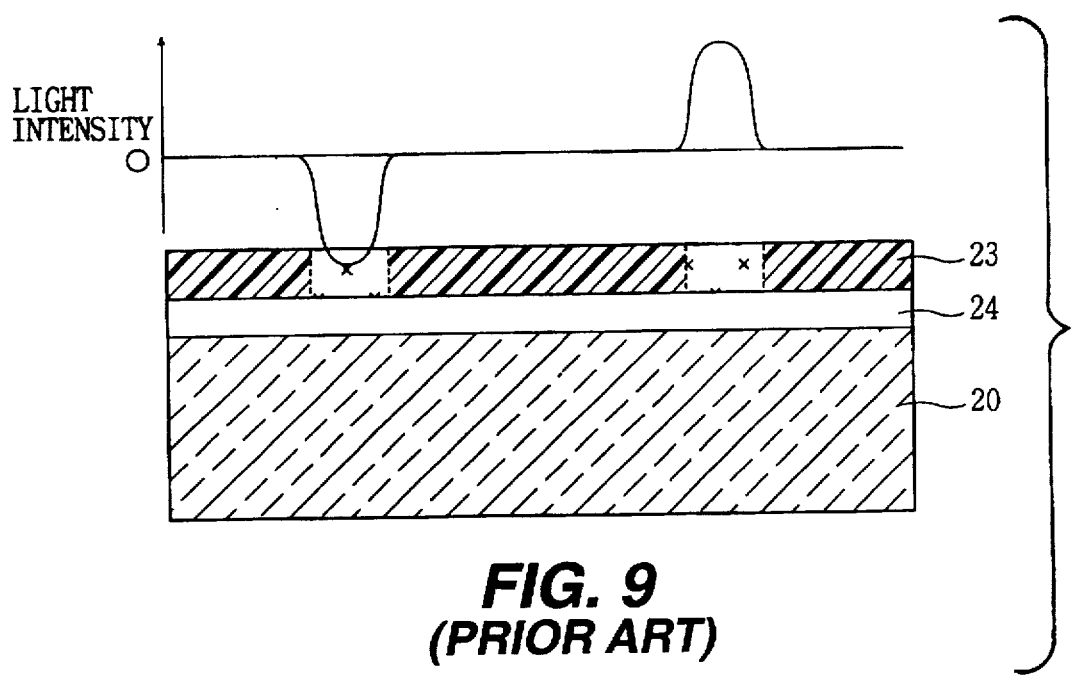
FIG. 9 is a sectional view IX—IX of FIG. 8.
Figure 10:
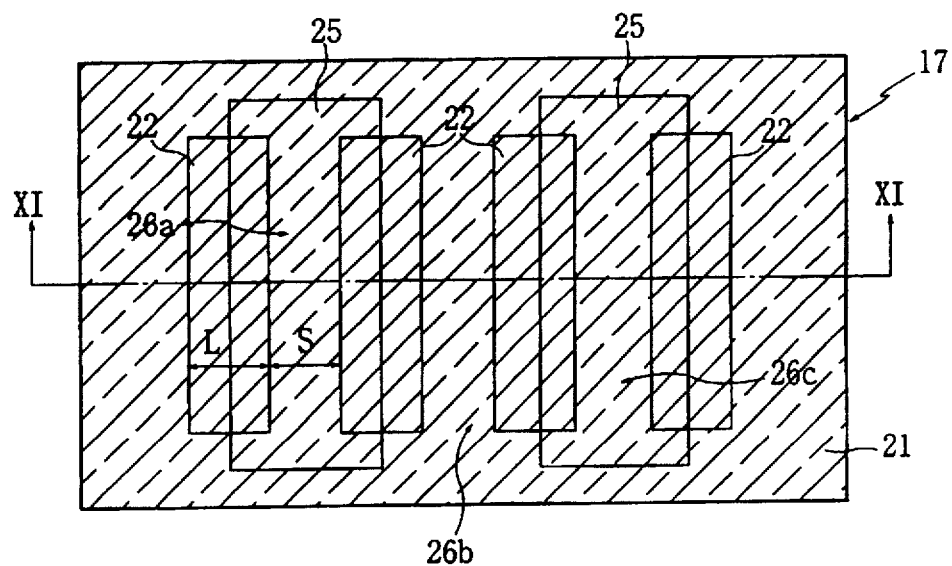
FIG. 10 is a plan view showing a phase shift mask used in a conventional light exposure step.
Figure 11:
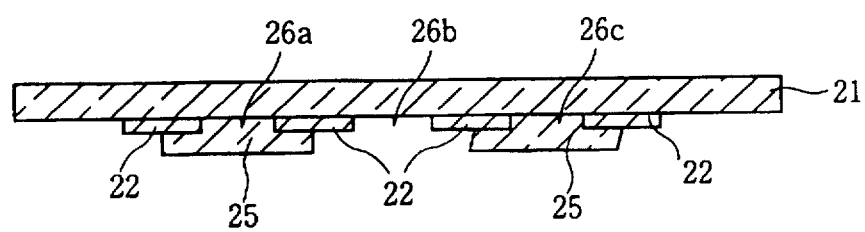
FIG. 11 is a sectional view XI—XI of FIG. 10.
Figure 12:
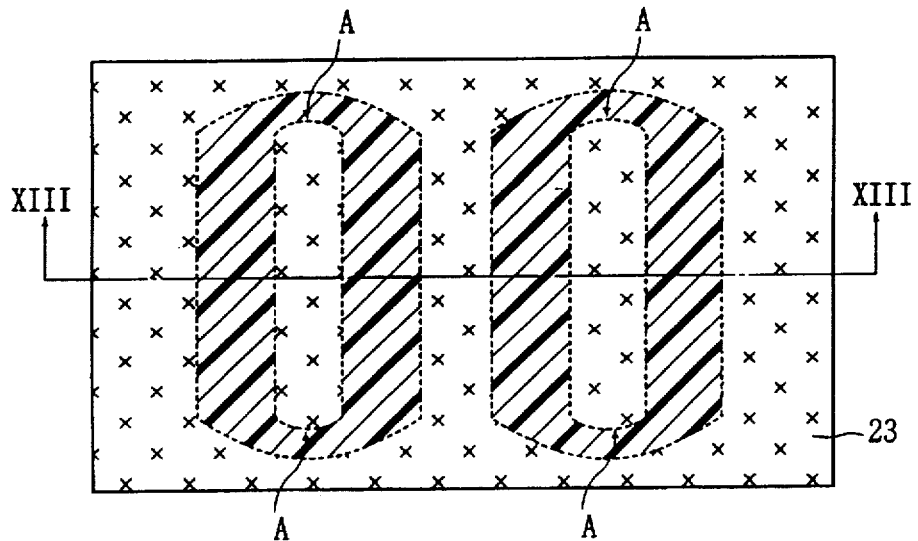
FIG. 12 is a plan view showing an exposed portion using the mask illustrated in FIG. 10.
Figure 13:
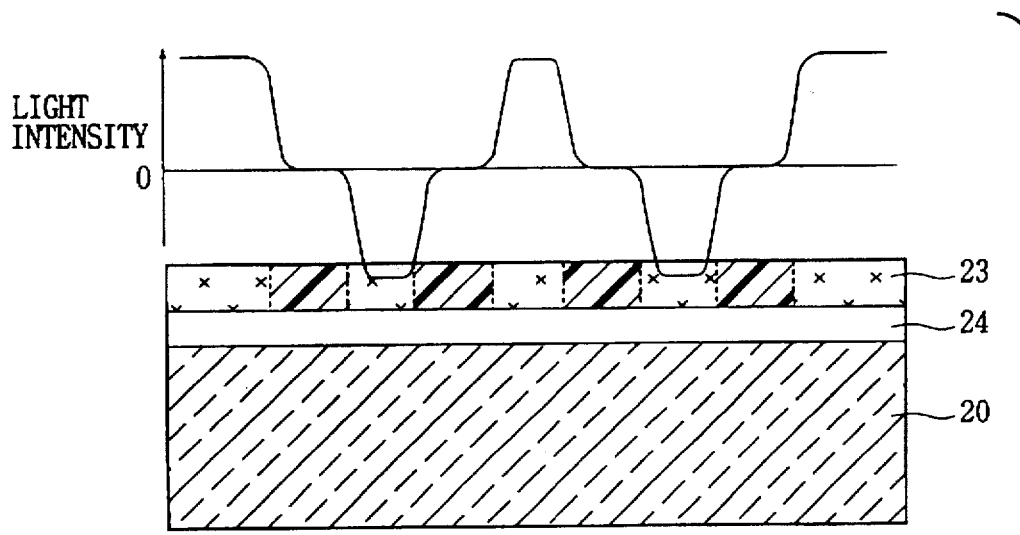
FIG. 13 is a sectional view XIII—XIII of FIG. 12.
Figure 14:
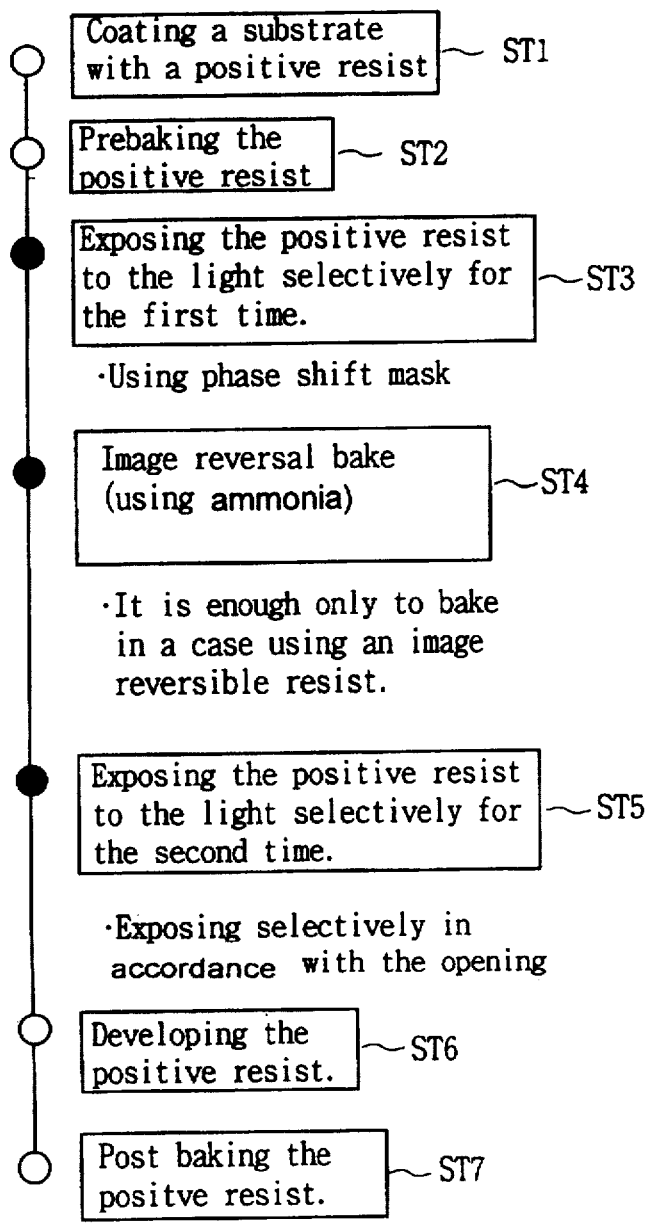
FIG. 14 is a flow chart showing a method of making a negative photoresist image in accordance with an embodiment of the present invention.

FIG. 14 is a flow chart illustrating an embodiment of the method of making a negative photoresist image in accordance with the invention.

Initially, a substrate is coated with a positive resist on the entire surface thereof, for example to a thickness of 1 µm to 2 µm (step ST1). The substrate with positive resist thereon is then prebaked (step ST2). The positive resist is then exposed to light selectively for the first time using a phase shift mask (step ST3). The mask has a pattern consisting of a mask membrane having portions spaced at intervals with openings between the membrane portions. For example, a ratio of a width of the membrane portion to a width of the opening, represented as "L/S" as described more fully below, is equal to 1. Moreover, the mask has an attenuator covering every other opening.

Subsequently, the substrate is baked in an amine gas atmosphere such as ammonia (step ST4). As a result, a portion of the positive resist exposed to the light in step ST3 changes into a material which cannot be removed in subsequent developing step. For further detail, it is enough only to bake in a case of using an image reversible resist instead of the positive resist. Step ST4 is referred to as an "image-reversal bake" step.

Subsequently, the positive resist is selectively exposed to light for a second time using a prescribed mask (step ST5). The mask has an opening formed in accordance with an opening of the phase shift mask, so that the mask covers an area corresponding to at least an edge portion of the attenuator of the phase shift mask which does not overlap the mask membrane portions.

After the exposure in step ST5, the positive resist is developed using a developer such as an alkali developer (step ST6). As a result, the positive resist at the portions exposed to radiation for the second time is dissolved and is thus removed. A postbaking step is then performed (step ST7). As stated above, in accordance with a method of making a negative photoresist image according to this invention, after the first exposure using the phase shift mask, the substrate is prebaked in an amine gas atmosphere such as ammonia. After the prebaking, the substrate is exposed for the second time using the prescribed mask. Accordingly, a shape of an opening of the prescribed mask is superimposed onto the positive resist and is effective to block from the second exposure a portion corresponding to an edge portion of the attenuator of phase shift mask which blocked exposure during the first exposure.

EXAMPLE

Figure 15:
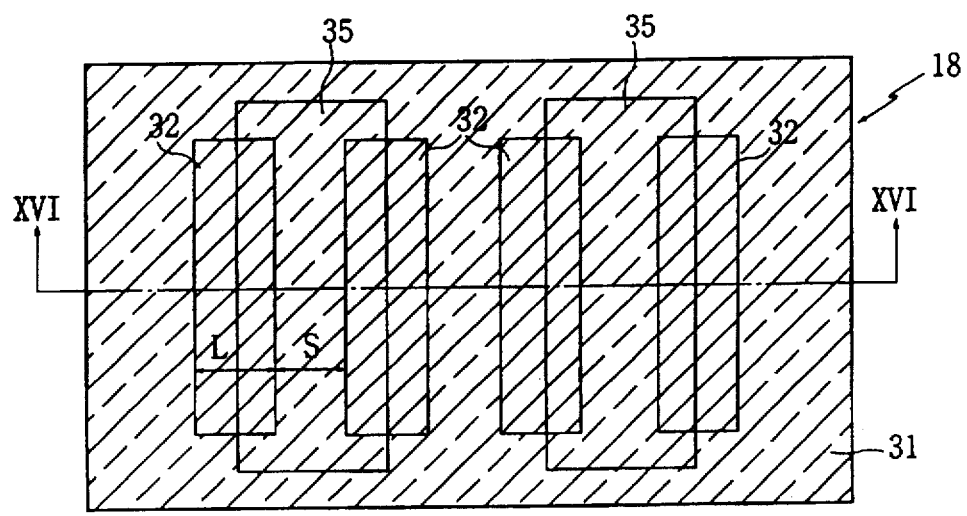
FIG. 15 is a plan view showing a phase shift mask used in a first light exposure step.
Figure 16:
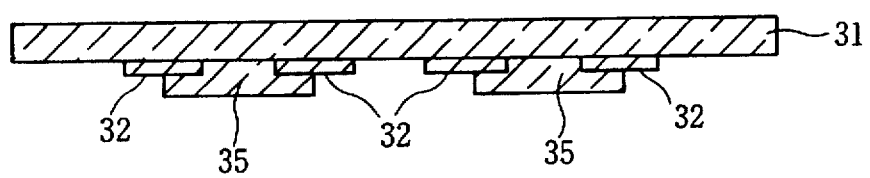
FIG. 16 is a sectional view XVI—XVI of FIG. 15.

FIGS. 15 and 16 show a phase shift mask 18 used in the first exposure step. As shown in FIGS. 15 and 16, the phase shift mask 18 has a mask membrane 32 made from opaque chromium, having a thickness of about 450 nm (in the case of g-beam exposure), or less than 400 nm (in the case of i-beam exposure), and open portions. The mask membrane 32 is formed on a glass substrate 31. The mask membrane 32 is formed with portions each in a shape of a rectangle having a width "L" of 0.3 μm to 0.8 μm. A distance "S" between each of the mask membrane 32 portions is 0.3 μm to 0.8 μm. Accordingly, L/S equals 1. An attenuator 35 masks every other opening. An edge of the attenuator 35 is placed on the glass substrate 31 and on the mask membrane 32 portions.

Figure 17:
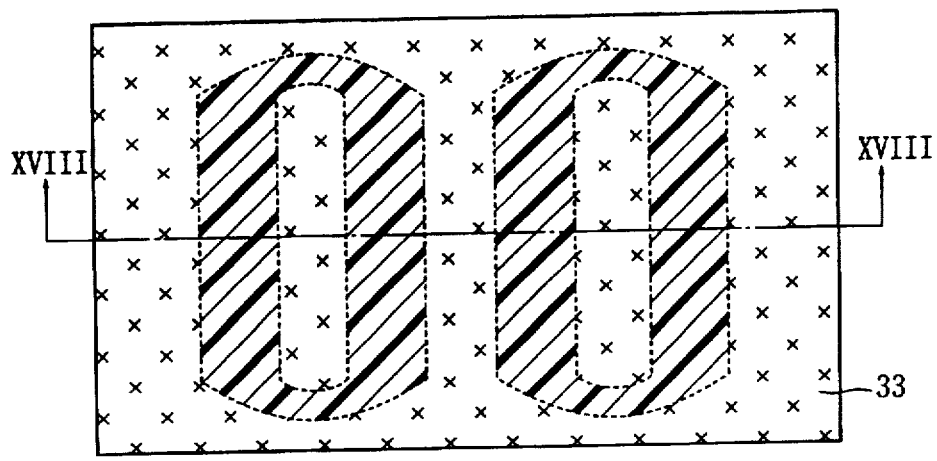
FIG. 17 is a plan view showing an exposed portion using the mask illustrated in FIG. 15.
Figure 18:
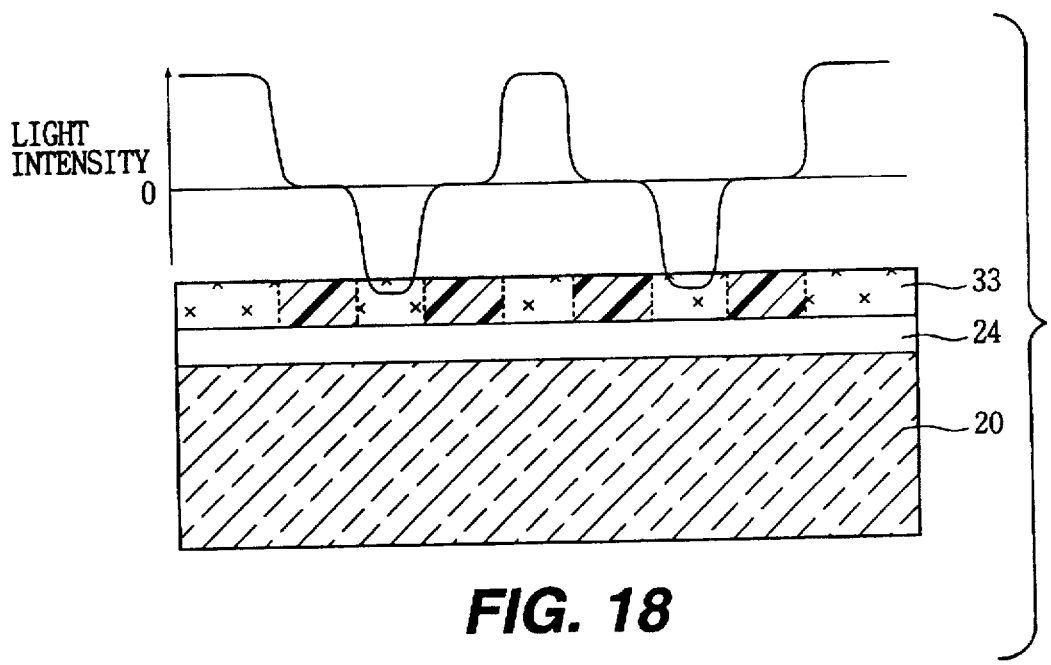
FIG. 18 is a sectional view XVIII—XVIII of FIG. 17.

FIG. 17 illustrates an exposed field of a positive resist 33 by light radiation passed through the phase shift mask 18. FIG. 18 is a sectional view XVIII—XVIII of FIG. 17. As shown in FIGS. 17 and 18, the positive resist 33 which can be provided as NPR-820DX sold by Nagase Sangyo, or THMR-ip015AXD20 sold by Tokyo Ohka is coated onto the substrate by means of, for example, rotating the substrate and applying the positive resist. After coating, the positive resist 33 is prebaked for 1 to 2 minutes at 90° to 110° C. Next, the positive resist 23 is exposed by light radiation which has a wavelength of 436 nm ("g-beam" radiation) or 365 nm ("i-beam" radiation) for the first time. As a result, a portion of the positive resist 33 corresponding to a portion of the phase shift mask 18 exclusive of the mask membrane 32 portions is exposed to the light radiation, and the exposed portion of the positive resist 33 becomes soluble in a developer solvent. FIGS. 17 and 18 show the portion of the positive resist 33 exposed to the light radiation by cross marks (X).

However, as described above with respect to conventional techniques, an edge potion of the attenuator 35 transmits a light intensity of about zero. As a result, a portion of the positive resist 33 corresponding to the edge portion of the attenuator 35 is not exposed to the light radiation.

Figure 19:
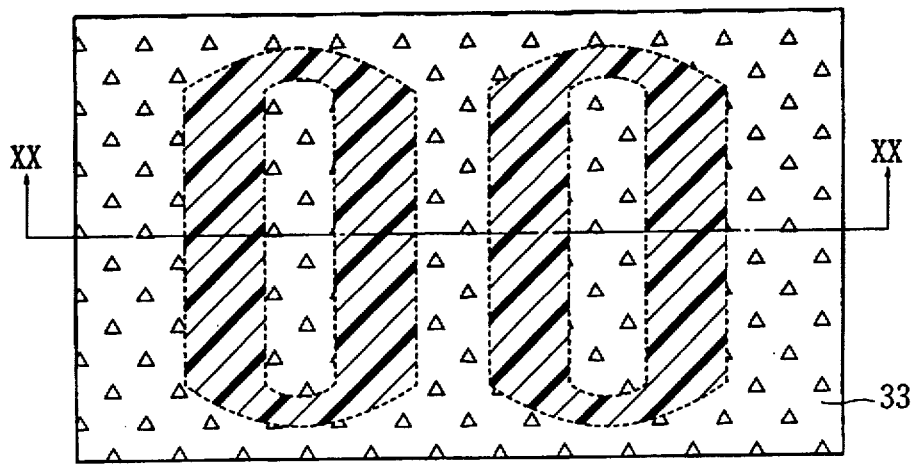
FIG. 19 is a plan view showing the substrate after undergoing an image-reversal bake step.
Figure 20:
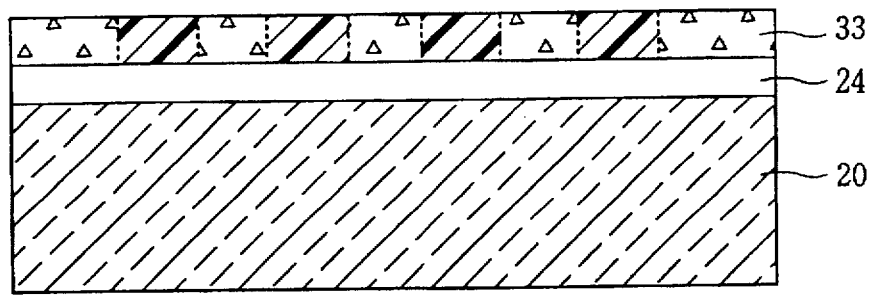
FIG. 20 is a sectional view XX—XX of FIG. 19.

The positive resist 33 which has experienced the exposure process is subjected to baking for about 45 minutes in an amine gas atmosphere such as ammonia at a temperature of 90° C. to 100° C. and a pressure of less than 1 Torr. As a result, in the portion of the positive resist 33 exposed to the light radiation, an indene carboxylic contained in the positive resist 33 as a photoactive compound is turned into alkali insoluble indene. More specifically, a carboxyl group in the indene carboxylic is dropped off, and produces the indene and $CO_2$. FIGS. 19 and 20 show the substrate after baking in the amine atmosphere. In FIGS. 19 and 20, the portion in which the indene is produced is indicated by a triangle mark (Δ). This baking step is referred to as an "image-reversal bake".

After baking the positive resist 33, the positive resist 33 is subjected to an exposure to light radiation which has a wavelength of 436 nm ("g-beam") or 365 nm ("i-beam") for the second time. The mask used in this exposure has an opening so that at least one of the intervals unexposed by the first exposure is exposed by this exposure.

Figure 21:
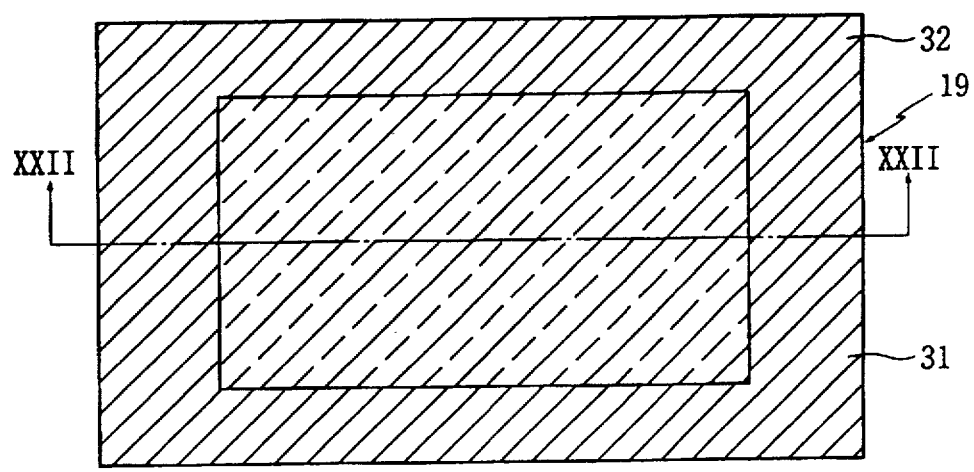
FIG. 21 is a plan view showing a phase shift mask used in a second light exposure step.
Figure 22:
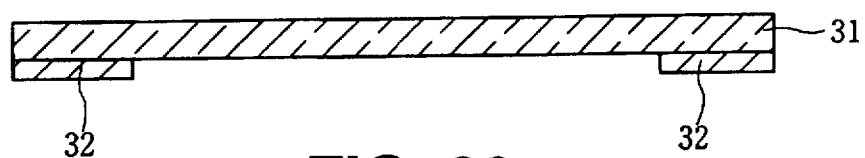
FIG. 22 is a sectional view XXII—XXII of FIG. 21.
Figure 23:
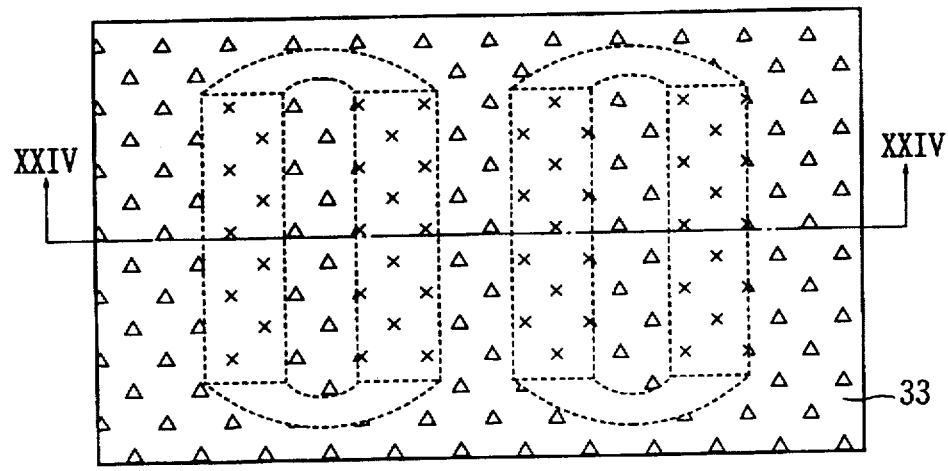
FIG. 23 is a plan view showing an exposed portion using the mask illustrated in FIG. 21.
Figure 24:
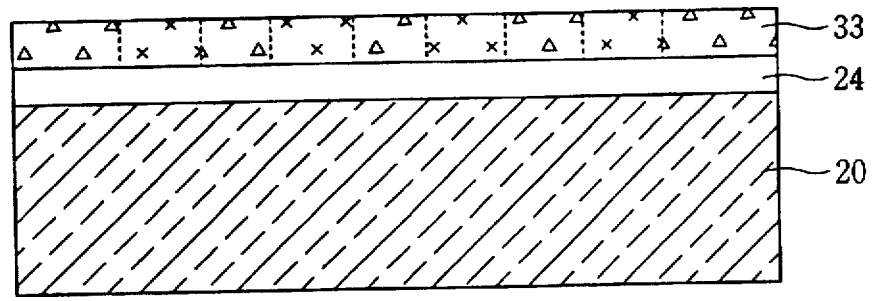
FIG. 24 is a sectional view XXIV—XXIV of FIG. 23.

FIGS. 21 and 22 illustrated a mask 19 having a mask membrane 32, on a glass substrate 31, which is positioned to cover optically at least a portion of the substrate corresponding to the edge portion of the attenuator exclusive of the edge portion of the attenuator which contacts the mask membrane of mask 18. FIGS. 23 and 24 illustrate the effect on the substrate of the second exposure. As a result of the second exposure, unexposed portions of the positive resist 33, i.e., the portions of the positive resist 33 which correspond with the portions of the mask membrane 32, are exposed. In FIGS. 23 and 24, the portions of the positive resist 33 subjected to the second exposure are identified by a cross mark (X).

Figure 25:
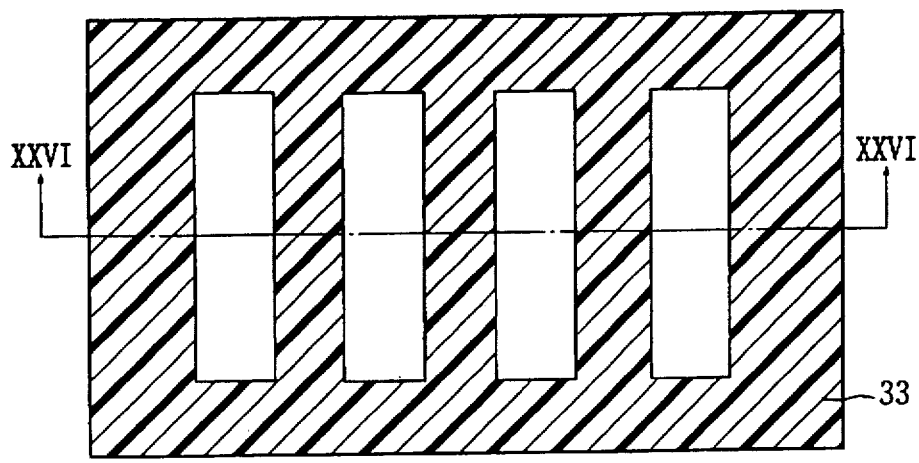
FIG. 25 is a plan view showing the substrate after undergoing a development step.
Figure 26:
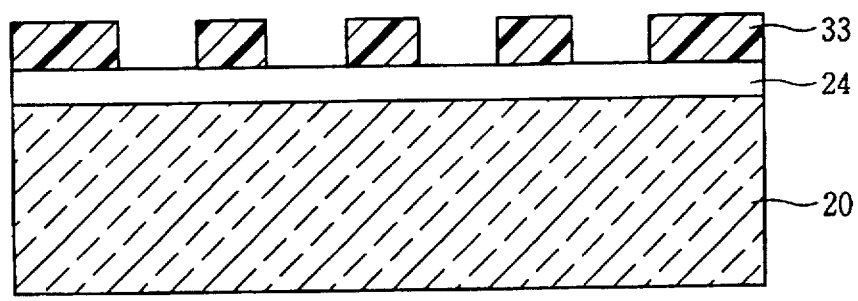
FIG. 26 is a sectional view XXVI—XXVI of FIG. 25.

After the second exposure, the substrate 20 is subjected to the development by an alkali developer, and the portions marked by the cross mark are developed by the alkali developer. The positive resist 33 is post-baked for 1 to 2 minutes at 90° to 110° C. FIGS. 25 and 26 illustrate the effect of the developing and post-baking. As shown in FIGS. 25 and 26, the positive resist 33 thus patterned is formed on the substrate 20 and has openings corresponding with the shape of the mask 18.

Figure 27:
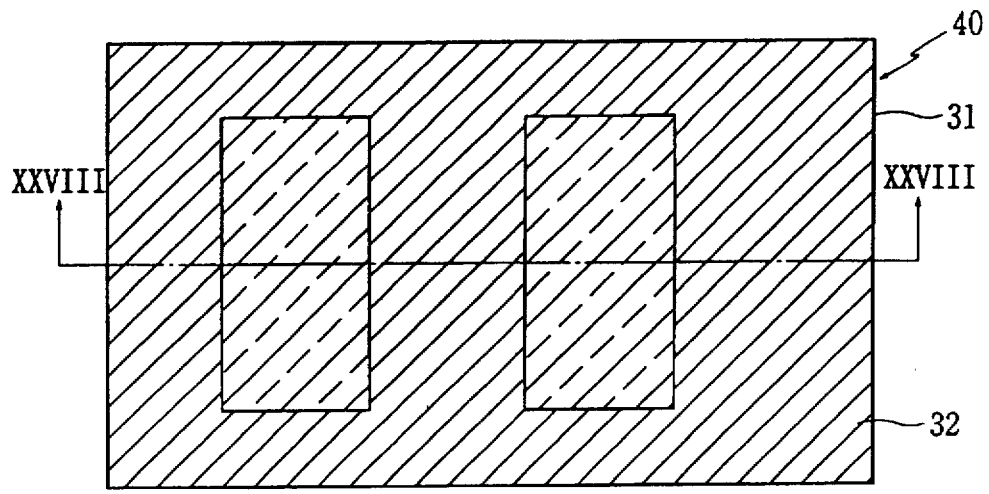
FIG. 27 is a plan view showing a phase shift mask used in the second light exposure step.
Figure 28:
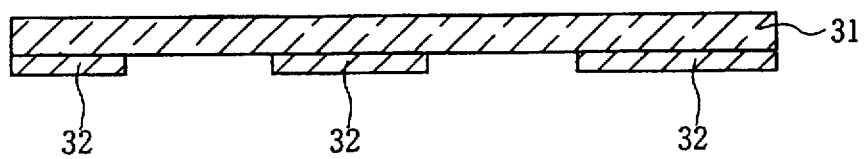
FIG. 28 is a sectional view XXVIII—XXVIII of FIG. 27.
Figure 29:
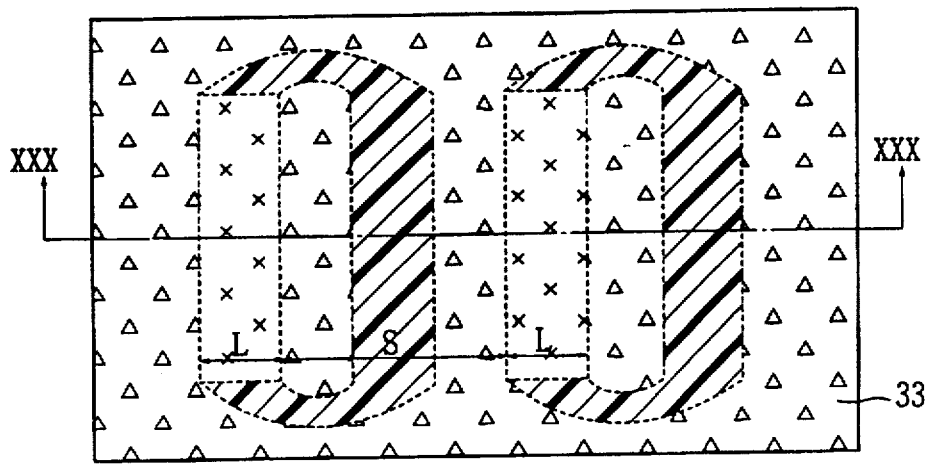
FIG. 29 is a plan view showing an exposed portion using the mask illustrated in FIG. 27.
Figure 30:
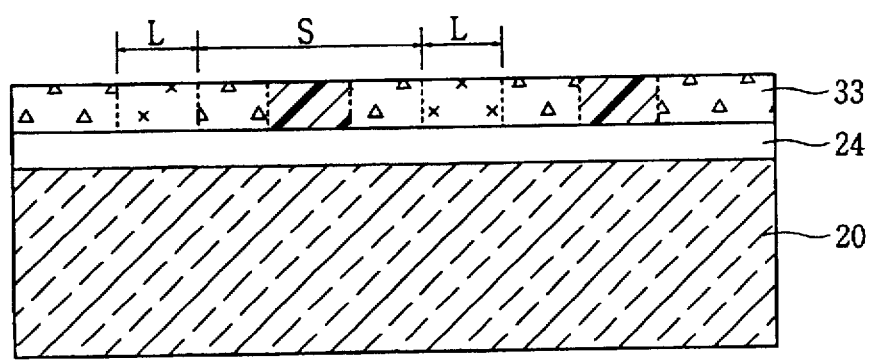
FIG. 30 is a sectional view XXX—XXX of FIG. 29.

As an alternative to using the mask 19, a mask 40 shown in FIGS. 27 and 28 can be used. As shown in FIGS. 27 and 28, the positive resist 33 is exposed by the light radiation for the second time using mask 40 which has two openings each having a width 0.6 to 1.6 μm, i.e., two times the width of each mask membrane 32 portion of mask 18, located at positions corresponding to alternate mask membrane portions of mask 18. In other words, an interval of this opening is equal to the width of this opening. FIGS. 29 and 30 illustrate the effect of the second exposure with mask 40 on the substrate. As the result of this second exposure, a portion of the positive resist 33 which is located in correspondence with the openings in mask 40 is exposed by the light radiation as shown by cross mark in FIGS. 29 and 30.

Figure 31:
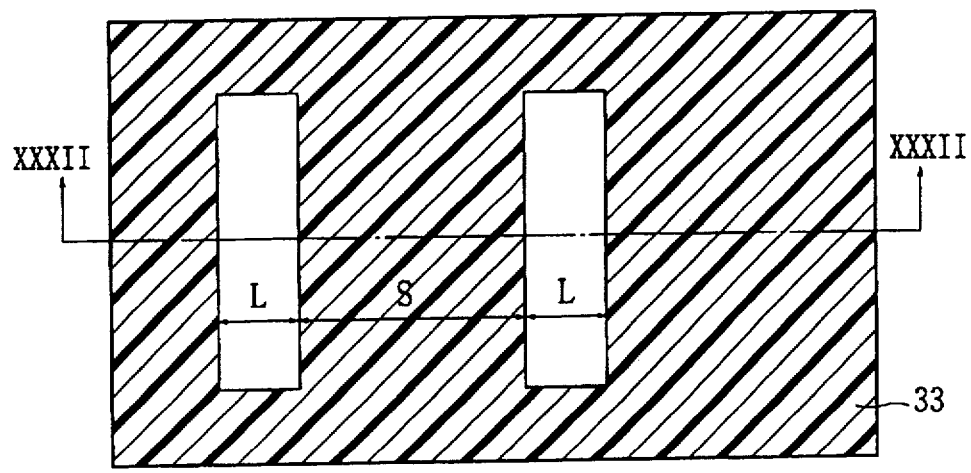
FIG. 31 is a plan view showing the substrate after undergoing the development step.
Figure 32:
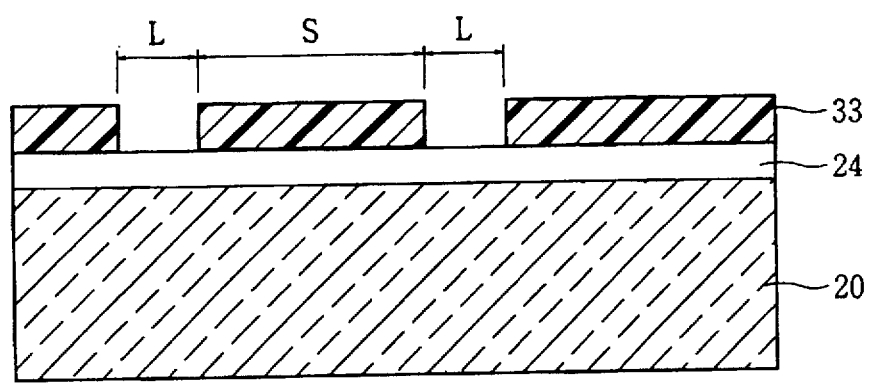
FIG. 32 is a sectional view XXXII—XXXII of FIG. 31.

FIGS. 31 and 32 illustrate the effect of the development and post-bake step performed on the substrate shown in FIGS. 29 and 30 after the second exposure. As shown in FIGS. 31 and 32, after development and post-bake, the positive resist 33 thus patterned accurately is formed on the substrate 20 which has openings corresponding with the shape of mask 40. In other word, the positive resist 33 thus patterned accurately is formed on the substrate 20 whose L/S is equal to 113.

Figure 33:
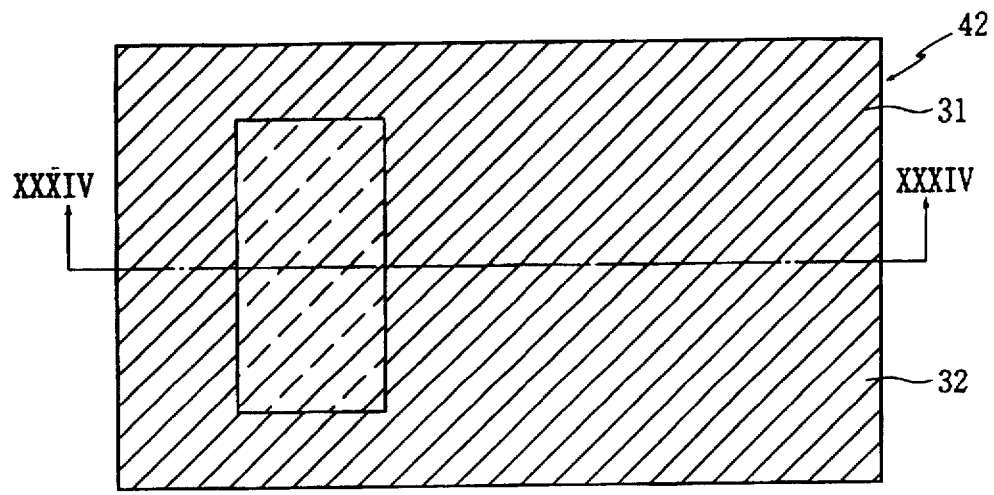
FIG. 33 is a plane view showing a phase shift mask used in the second light exposure step.
Figure 34:
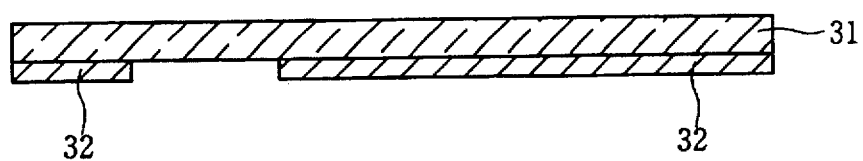
FIG. 34 is a sectional view XXXIV—XXXIV of FIG. 33.
Figure 35:
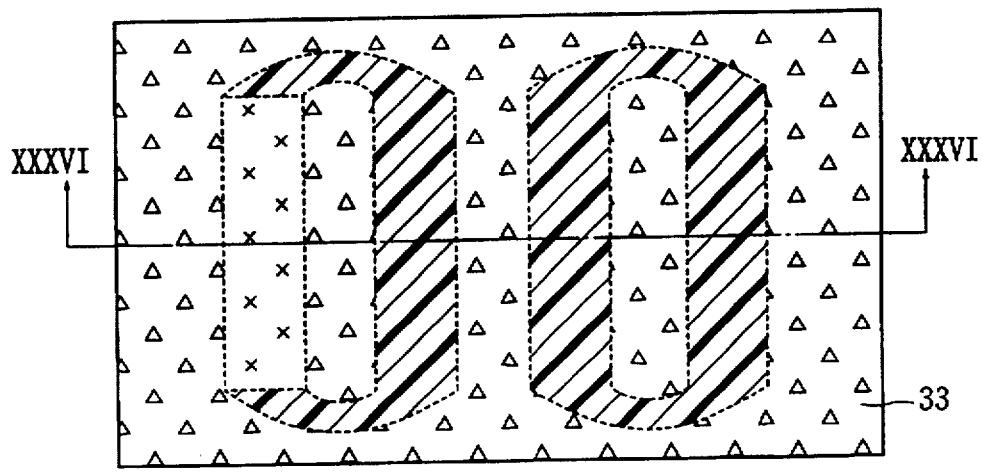
FIG. 35 is a plan view showing an exposed portion using the mask illustrated in FIG. 33.
Figure 36:
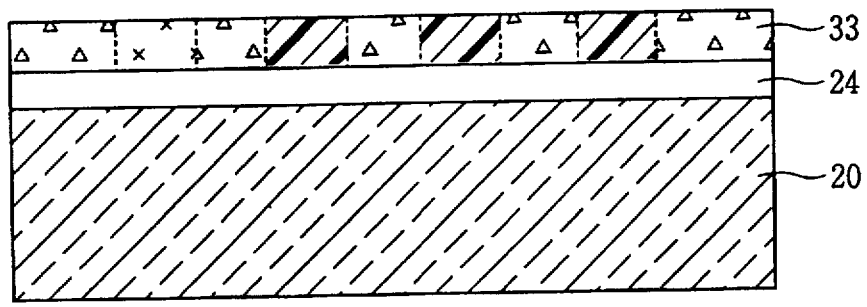
FIG. 36 is a sectional view XXXVI—XXXVI of FIG. 35.

As an alternative to using either of the masks 19 and 40 a mask 42 shown in FIGS. 33 and 34 can be used. As shown in FIGS. 33 and 34, the positive resist 33 is exposed by the light radiation for the second time using mask 42 which has one opening having a width 0.3 to 0.8 μm. i.e., equal to the width of one mask membrane 32 portion of mask 18, located at positions corresponding to one of the mask membrane 32 portions. FIGS. 35 and 36 illustrate the effect of the second exposure with mask 42 on the substrate. As a result of this second exposure, a portion of the positive resist 33 which is located at the position corresponding to the opening in mask 42 is exposed by the light radiation as shown by cross marks in FIGS. 35 and 36.

Figure 37:
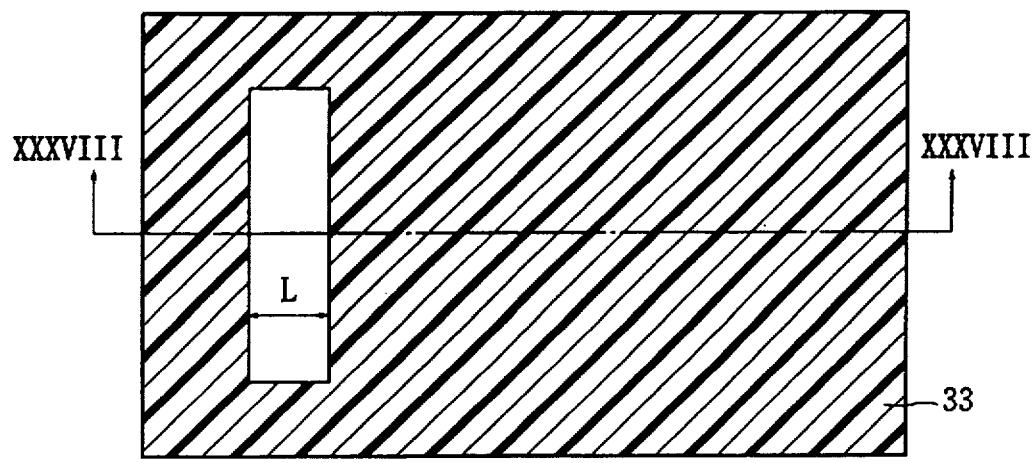
FIG. 37 is a plan view showing the substrate after undergoing the development step.
Figure 38:
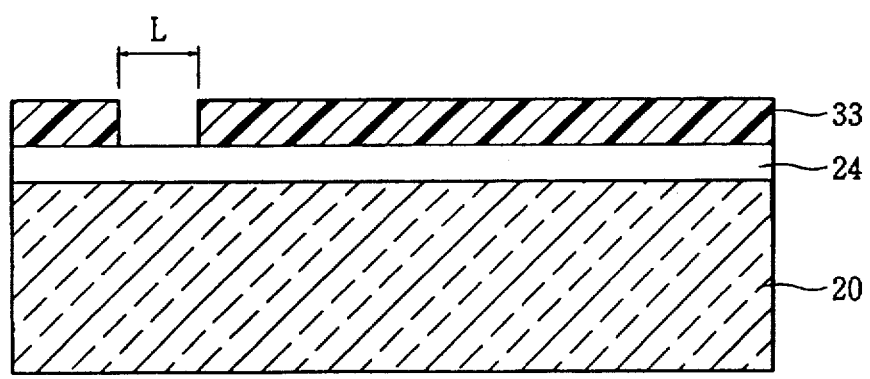
FIG. 38 is a sectional view XXXVIII—XXXVIII of FIG. 37.

FIGS. 37 and 38 illustrate the effect of the development and post-bake steps performed on the substrate shown in FIGS. 35 and 36 after the second exposure. As shown in FIGS. 37 and 38, after development and post-bake, the positive resist 33 thus patterned accurately is formed on the substrate 20 which has an opening corresponding with the shape of one of the mask membrane 32 portions. In other word, the positive resist 33 thus patterned accurately is formed to have a single opening on the substrate 20 whose L/S is nearly equal to zero.

As described above, in accordance with the method of making a negative photoresist image, the substrate 20 is subjected to an "image-reversal bake" after the exposure for the first time using the phase shift mask. Moreover, the positive resist is exposed to the light radiation for the second time using a mask which has an opening so that at least one of the intervals unexposed by the exposure for the first time is exposed.

As a result, the pattern of the phase shift mask can be accurately copied to the positive resist. The disadvantage of a portion of the positive resist corresponding to the edge portion of the attenuator, and blocking the photoresist from exposure of light radiation is overcome. Consequently, it is possible to pattern the positive resist finely and accurately, and etching a layer formed under the positive resist.

Additional advantages and modification will readily occur to those skilled in the art. The invention in its broader aspect is therefore not limited to the specific details, representative apparatus and method, and illustrative examples shown and described. Accordingly, departures may be made from such details without departing from the spirit or scope of the general inventive concept. Thus, it is intended that this invention cover the modifications and variations of the invention provided they are within the scope of the appended claims and their equivalents.

What is claimed is:

1. A method of making a negative photoresist image comprising the steps of:
    selectively exposing to light through a phase shift mask a positive resist layer on a substrate, the phase shift mask including a first mask portion and an attenuator, said first mask portion having at least two mask membrane portions, and said attenuator positioned to cover an area between said at least two membrane portions;
    changing an exposed portion of said positive resist layer to be resistant to developer;
    selectively exposing to light the positive resist layer through a second mask which blocks exposure of an unexposed portion of the positive resist layer corresponding to a peripheral portion of the attenuator that does not overlap with said first mask portion; and
    developing said positive resist layer.

2. The method of making a negative photoresist image according to claim 1 wherein the step of selectively exposing to light through a phase shift mask includes a step of providing said at least two mask membrane portions such that the width of one of said at least two mask membrane portions is substantially equal to a distance between said at least two mask membrane portions.

3. The method of making a negative photoresist image according to claim 2 wherein the step of selectively exposing to light through a phase shift mask includes a step of providing said attenuator so that a width of said attenuator is two times the distance between said at least two mask membrane portions.

4. The method of making a negative photoresist image according to claim 1 wherein the step of selectively exposing to light through a second mask includes a step of providing said second mask with an opening so that a portion of said positive resist layer corresponding to at least one of said mask membrane portions of the phase shift mask is exposed through said second mask.

5. The method of making a negative photoresist image according to claim 1 wherein the step of selectively exposing to light through a second mask includes a step of providing said second mask with an opening so that a portion of said positive resist layer corresponding to all of said mask membrane portions is exposed through said second mask.

6. The method of making a negative photoresist image according to claim 1 wherein said first mask portion includes at least three mask membrane portions, wherein the step of selectively exposing to light through a second mask includes a step of providing said second mask with an opening so that a portion of said positive resist layer corresponding to alternate ones of said mask membrane portions is exposed through said second mask.

7. The method of making a negative photoresist image according to claim 1 wherein said first mask portion includes at least three mask membrane portions, wherein the step of selectively exposing to light through a second mask includes a step of providing said second mask with an opening so that a portion of said positive resist layer corresponding to only one of said mask membrane portions is exposed through said second mask.

8. The method of making a negative photoresist image according to claim 1, wherein the step of selectively exposing to light through said phase shift mask includes a step of providing said attenuator made of $SiO_2$.

9. The method of making a negative photoresist image according to claim 1, wherein the step of selectively exposing to light through said phase shift mask includes a step of providing said mask membrane made of chromium.

10. The method of making a negative photoresist image according to claim 1, wherein the step of selectively exposing to light through said phase shift mask includes a step of providing the light with a wavelength of 436 nm.

11. The method of making a negative photoresist image according to claim 1, wherein the step of selectively exposing to light through said phase shift mask includes a step of providing the light with a wavelength of 365 nm.

12. The method of making a negative photoresist image according to claim 1, wherein the changing step includes a step of heating said positive resist layer in an ammonia atmosphere.

13. The method of making a negative photoresist image according to claim 1, wherein said positive resist layer is composed of light reactive resist material, said changing step including a step of heating said positive resist layer.

14. The method of making a negative photoresist image according to claim 1, wherein said developing step includes a step of developing said positive resist layer in an alkali developer.

15. The method of making a negative photoresist image according to claim 1, wherein said changing step includes a step of changing the exposed portion of said positive resist layer to be alkali-insoluble.

* * * * *